(12) United States Patent
Yamawaki

(10) Patent No.: US 8,217,660 B2
(45) Date of Patent: Jul. 10, 2012

(54) OPEN TERMINAL DETECTION DEVICE AND SEMICONDUCTOR DEVICE

(75) Inventor: Hideo Yamawaki, Toyota (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 325 days.

(21) Appl. No.: 12/683,752

(22) Filed: Jan. 7, 2010

(65) Prior Publication Data

US 2010/0207639 A1    Aug. 19, 2010

(30) Foreign Application Priority Data

Feb. 16, 2009    (JP) .................................. 2009-032685

(51) Int. Cl.
*G01R 31/02*    (2006.01)
(52) U.S. Cl. ........................................ 324/500; 324/555
(58) Field of Classification Search .................. 324/500, 324/537, 555; 327/310, 322, 323
See application file for complete search history.

(56) References Cited

U.S. PATENT DOCUMENTS

| | | | | |
|---|---|---|---|---|
| 4,468,725 A | * | 8/1984 | Venturini | 363/160 |
| 4,612,453 A | * | 9/1986 | Yamazaki | 327/322 |
| 6,407,633 B1 | * | 6/2002 | Dao | 330/86 |

FOREIGN PATENT DOCUMENTS

| | | |
|---|---|---|
| EP | 0 075 079 A1 | 3/1983 |
| EP | 195 42 989 B4 | 4/2006 |
| JP | A-2003-274644 | 9/2003 |

OTHER PUBLICATIONS

Office Action issued in corresponding German Patent Application No. 10 2010 001952.6-35 dated Jan. 11, 2011 (With Translation).

* cited by examiner

*Primary Examiner* — Vincent Q Nguyen
(74) *Attorney, Agent, or Firm* — Oliff & Berridge, PLC

(57) ABSTRACT

An open terminal detection device that detects an open terminal, including: a transistor that is supplied with a base current from a current source in which an amount of current supply decreases corresponding to an increase in an external impedance of the terminal; a diode that limits discharge of a base charge of the transistor; and an output circuit that outputs an output signal in coordination with on/off switching of the transistor.

6 Claims, 5 Drawing Sheets

OPEN TERMINAL DETECTION DEVICE AND SEMICONDUCTOR DEVICE

INCORPORATION BY REFERENCE

The disclosure of Japanese Patent Application No. 2009-032685 filed on Feb. 16, 2009, including the specification, drawings and abstract, is incorporated herein by reference in its entirety.

BACKGROUND OF THE INVENTION

1. Field of the Invention

The invention relates to an open terminal detection device that detects an open terminal and a semiconductor device provided with the open terminal detection device.

2. Description of the Related Art

Japanese Patent Application Publication No. 2003-274644 (JP-A-2003-274644) describes a semiconductor device that protects a switching element against interruption of the switching operation thereof by detecting an open state of a terminal. As shown in FIG. 3 of JP-A-2003-274644, this semiconductor device detects the open status of a terminal after a fixed amount of time has elapsed after an open terminal has actually occurred.

However, in the case of the technology disclosed in JP-A-2003-274644 in its present form, it is unable to promptly detect that a terminal has recovered to a normal state even after the status of the terminal has recovered from an open state to the normal state.

SUMMARY OF THE INVENTION

The invention provides an open terminal detection device, which is able to provide a difference between an abnormality determination time from the time an open terminal has occurred until the time the open terminal is detected, and a normal recovery time from the time the terminal has recovered to a normal state to the time that recovery is detected, and a semiconductor device provided with the open terminal detection device.

A first aspect of the invention relates to an open terminal detection device that detects an open terminal. This open terminal detection device is provided with a transistor that is supplied with a base current from a current source in which an amount of current supply decreases corresponding to an increase in an external impedance of the terminal, a diode that limits discharge of a base charge of the transistor, and an output circuit that outputs an output signal in coordination with on/off switching of the transistor.

According to the open terminal detection device and semiconductor device as claimed in the aspects of the invention, a difference can be provided between an abnormality determination time from the time an open terminal has occurred until the time the open terminal is detected, and a normal recovery time from the time the terminal has recovered to a normal state to the time that recovery is detected.

BRIEF DESCRIPTION OF THE DRAWINGS

The foregoing and further features and advantages of the invention will become apparent from the following description of preferred embodiments with reference to the accompanying drawings, wherein like numerals are used to represent like elements and wherein.

DETAILED DESCRIPTION OF EMBODIMENTS

Figure 1:
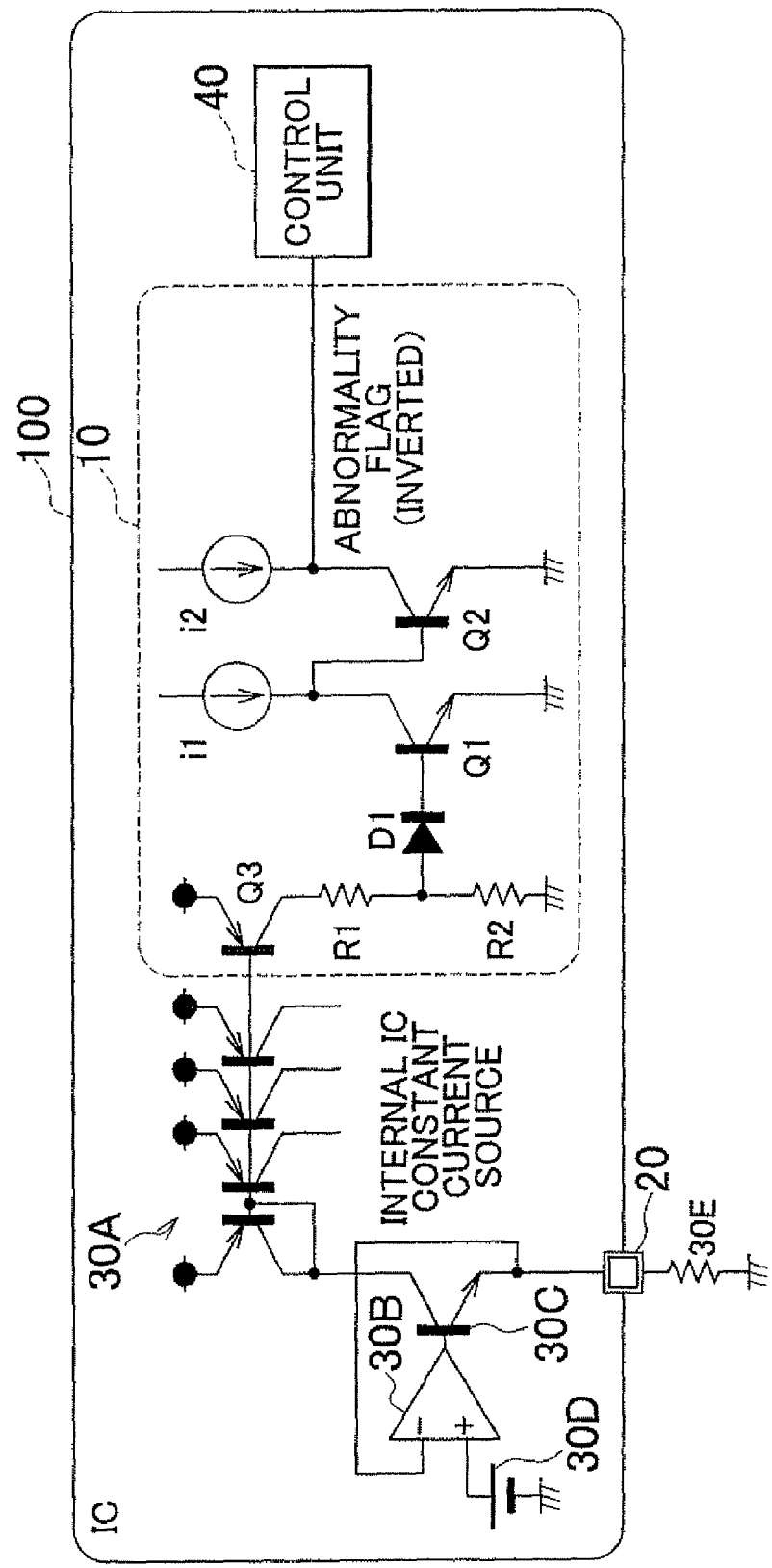
FIG. 1 is a block diagram of an embodiment of the invention in the form of a semiconductor device.

The following provides an explanation of embodiments of the invention with reference to the drawings. FIG. 1 is a block diagram of an embodiment of the invention in the form of a semiconductor device 100. The semiconductor device 100 is provided with a semiconductor integrated circuit (IC) in the form of an open terminal detection circuit 10 that detects an open failure of a terminal 20 of the semiconductor device 100 and recovery from that open failure. An externally mounted resistor 30E, which is mounted on the same board as the board on which the semiconductor device 100 is mounted, is connected to the terminal 20 that enables the semiconductor device 100 to be connected to an external component. Namely, when in the normal state, the terminal 20 is shorted to ground through the externally mounted resistor 30E. The open terminal detection circuit 10 detects that the terminal 20 of the IC is open as a result of the occurrence of an abnormality in the externally mounted resistor 30E caused by, for example, defective soldering or heat stress during mounting of the printed circuit board.

In the case an open IC terminal has been detected, an abnormality flag is required to be raised when the abnormal state that causes the terminal 20 to be open has continued for a fixed amount of time in order to prevent incorrect determination of noise and the like. In addition, in the case the abnormal state of the IC terminal has recovered to the normal state, the abnormality flag is required to be taken down promptly.

Figure 2:
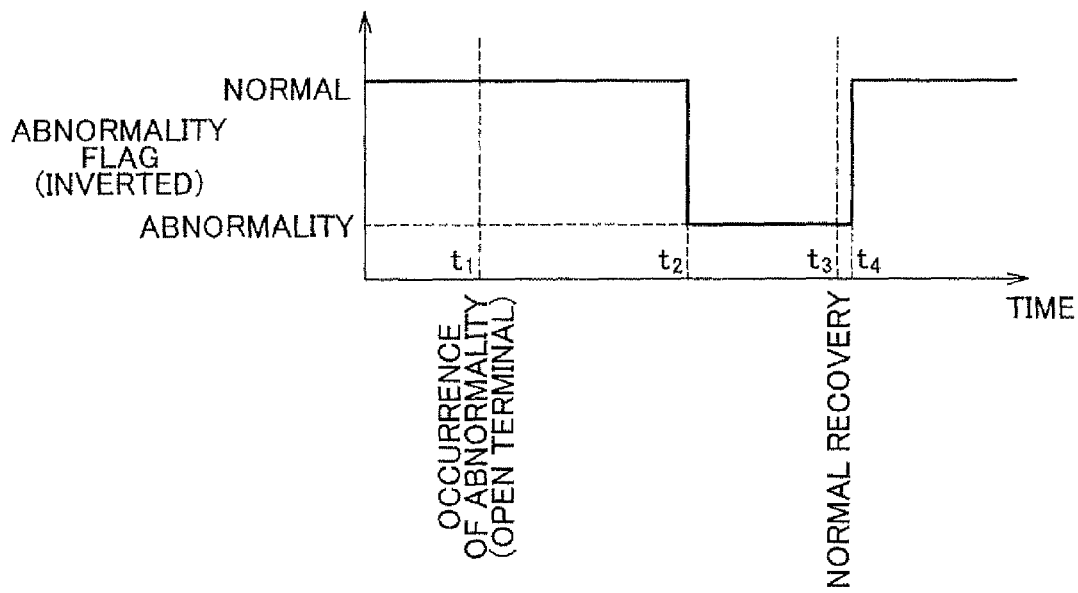
FIG. 2 is a timing chart showing the detection timing of an open terminal detection device.

FIG. 2 is a timing chart showing the detection timing of the open terminal detection circuit 10. The open terminal detection circuit 10 outputs an abnormality flag that indicates that the terminal 20 is open due to the occurrence of an abnormality such as cracked solder in the externally mounted resistor 30E, and that the open terminal 20 has been detected after a prescribed amount of time has elapsed (detection time t2) from the time t1 at which the abnormality that caused the terminal 20 to open occurred. Erroneous operation caused by noise and the like can be prevented by providing a predetermined time (for example, 50 μs) or longer for the abnormality determination time from the abnormality occurrence time t1 to the time t2 at which that abnormality was detected. If the status of the terminal 20 recovers from an abnormal state in which the terminal 20 is open to a normal state in which the terminal 20 is not open within a recovery time t3 following the abnormality detection time t2, the open terminal detection circuit 10 promptly detects that recovery after the recovery time t3. The open terminal detection circuit 10 then takes down the abnormality flag at a detection time t4 at which recovery from the abnormal state to the normal state is detected. The time during which a status is incorrectly recognized to be abnormal despite actually being normal can be shortened by shortening the normal recovery time from recovery of the terminal 20 to the normal state to the time that recovery is detected (namely, t3–t4).

The following provides a detailed explanation of the configuration of the open terminal detection circuit 10 that operates as shown in FIG. 2 and the configuration of the semiconductor device 100 provided with the open terminal detection circuit 10 with reference to FIG. 1. The semiconductor device 100 integrates the open terminal detection circuit 10, a current source 30A, an operational amplifier 30B, an output transistor 30C that drives corresponding to the output of the operational amplifier 30B, a reference power supply 30D, and a control unit 40. A constant current source 30 is composed by the current source 30A, the output transistor 30C in which the collector thereof is connected downstream from the current source 30A, the reference power supply 30D that generates a reference voltage by splitting resistance and the like, the operational amplifier 30B, which amplifies the voltage difference between an emitter of the npn-type output transistor 30C and the reference power supply 30D, and the externally mounted resistor 30E connected to the emitter of the output transistor 30C through the terminal 20.

The current source 30A in the form of a constituent of the constant current source 30 has a plurality of current supply paths, a path that supplies current to the transistor 30C, and a path that supplies current to circuit elements other than the transistor 30C. The current source 30A is a current mirror device in which the amount of current supplied decreases corresponding to an increase in external impedance of the terminal 20. The external impedance shown in FIG. 1 is equivalent to the amount of the resistance of the externally mounted resistor 30E. The current value of current flowing out from the terminal 20 becomes smaller as the external impedance of the terminal 20 increases. When the external impedance of the terminal 20 becomes infinitely large (or in other words, the terminal 20 is open), current no longer flows out from the terminal 20. In other words, although the current source 30A is able to supply current to other circuits as well as a result of current flowing out from the terminal 20, it interrupts the supply of current to other circuits if current is unable to flow out from the terminal 20.

Furthermore, the configuration of the constant current source 30 is not limited to that shown in FIG. 1 provided it is an internal IC constant current generation circuit that consists of the combination of an IC externally mounted resistor externally mounted on an IC terminal and an IC.

Figure 3:
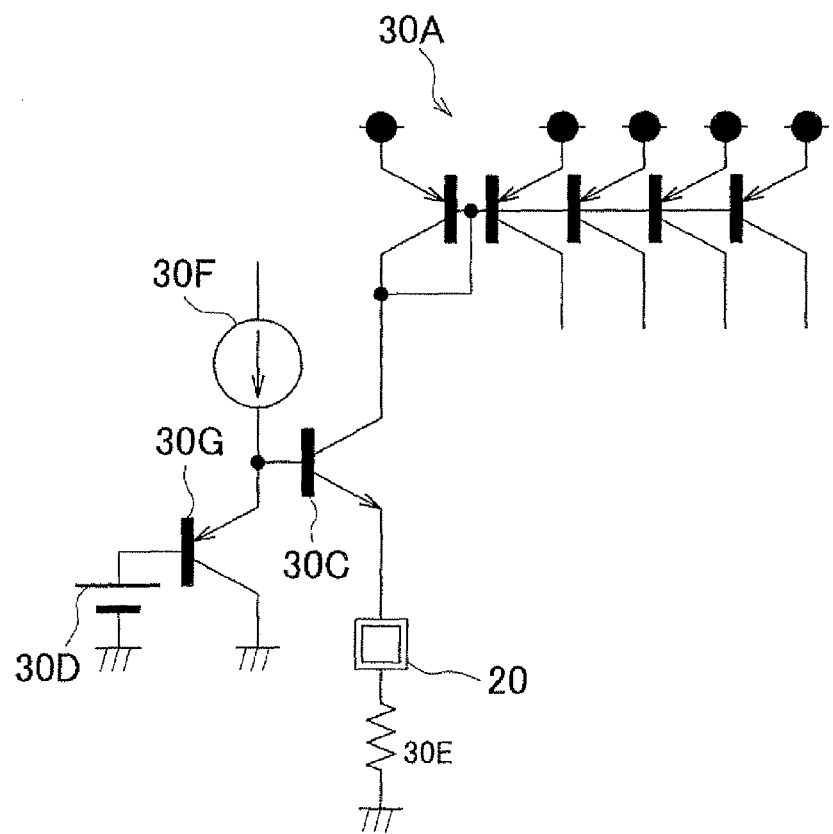
FIG. 3 shows an example of another different configuration of a constant current source.

FIG. 3 shows an example of another different configuration of the constant current source 30. The constant current source 30 of FIG. 3 supplies a constant current by being provided with the current source 30A, the output transistor 30C in which the collector thereof is connected downstream from the current source 30A, the reference power supply 30D that generates a reference voltage by splitting resistance and the like, a PNP transistor 30G in which the reference voltage of the reference power supply 30D is supplied to the base thereof, a constant current source 30F that supplies a constant current to the connection between the base of the output transistor 30C and the emitter of the PNP transistor 30G, and the externally mounted resistor 30E connected to the emitter of the output transistor 30C through the terminal 20.

In FIG. 1, the open terminal detection circuit 10 is provided with a first transistor (transistor Q1) to which is supplied a base current from one of the supply paths (transistor Q3) of the plurality of supply paths of the current source 30A, a diode D1 that limits discharge of a base charge of the transistor Q1, and an output circuit that contains a second transistor (transistor Q2) that outputs an output signal in coordination with on-off switching of the transistor Q1.

An internal power supply voltage of an IC is connected to the emitter of the transistor Q3. In addition, a voltage divider circuit that directly connects a resistor R1 and a resistor R2 is provided between the collector of the transistor Q3 and ground. Current flowing out from the transistor Q3 of the current source 30A is supplied to the base of the transistor Q1 through the diode D1 in the form of base current that drives the transistor Q1.

The diode D1 is inserted into a supply path that supplies base current to the transistor Q1. A PN junction of a transistor may also be used for the diode D1. As is indicated in FIG. 1, by arranging the diode D1 so that discharge of base charge from the transistor Q1 is limited, the off time of the transistor Q1 can be prolonged as compared with not arranging the diode D1 in this manner. In the case of FIG. 1, the anode of the diode D1 is connected to the connection between the resistor R1 and the resistor R2, while the cathode of the diode D1 is connected to the base of the transistor Q1.

An output signal in coordination with on/off switching of the transistor Q1 is output to the control unit 40 in the form of a status signal that indicates open or non-open status of the terminal 20. Constant current sources i1 and i2 and the transistor Q2 are provided for the output circuit that outputs the status signal to the control unit 40. The connection between the collector of the transistor Q1 and the base of the transistor Q2 is connected downstream from the constant current source i1. The collector of the transistor Q2 connected downstream from the constant current source i2 is connected to the control unit 40. As a result of providing the transistor Q2 after the transistor Q1, a status signal in which the logic level of the output of the transistor Q1 is inverted can be output to the control unit 40.

Furthermore, a circuit that omits the constant current source i2 and the transistor Q2 and connects the connection between the downstream side of the constant current source i1 and the collector of the transistor Q1 to the control unit 40 may also be used for the output circuit that outputs the status signal that indicates open or non-open status of the terminal 20 to the control unit 40. In this case, polarity that indicates normal or abnormal status of the terminal 20 is inverted relative to the polarity shown in FIG. 2.

The control unit 40 is a means for carrying out control corresponding to the open or non-open status of the terminal 20 based on the logic level of the status signal. In the case a status signal of a logic level that indicates an abnormal state in which the terminal 20 is open has been input, the control unit 40 carries out a predetermined operation corresponding to the abnormal state, while in the case a status signal of a logic level that indicates a normal state in which the terminal 20 is not open has been input, the control unit 40 carries out a predetermined operation corresponding to the normal state. For example, in the case the control unit 40 is used in an application in which a drive signal that drives a power MOS, IGBT or other semiconductor switching element is output in the form of an output signal of the semiconductor device 100, output of the drive signal is interrupted at the point an abnormal state in which the terminal 20 is open has been detected. As a result of the terminal 20 being open, an abnormal state occurs in which a predetermined constant current from the constant current source 30 can no longer be supplied to each circuit of the semiconductor device 100. Thus, the semiconductor switching element can be prevented from continuing to be driven in an abnormal state in which constant current is unable to be normally supplied as a result of the terminal 20 being open.

Furthermore, the control unit 40 may also be a circuit that contains a transistor that outputs a pulse signal corresponding to the status signal, or a higher circuit element such as microcomputer equipped with memory.

Continuing, the following provides an explanation of the operation of the semiconductor device 100. In a normal state in which the terminal 20 is not open, the transistor Q1 is on as a result of base current being injected thereto since the transistor Q3 is on. Since the transistor Q2 is off as a result of the transistor Q1 being on, an H level status signal that indicates a normal state is continued to be output to the control unit 40. Conversely, in an abnormal state in which the terminal 20 is open, the transistor Q1 is off as a result of the transistor Q3 being switched off. Since the transistor Q2 is on as a result of the transistor Q1 being off, a L level status signal that indicates an abnormal state is continued to be output to the control unit 40.

Here, when an abnormal state has occurred as a result of the terminal 20 being open, discharge of the base charge of the transistor Q1 is interrupted by the diode D1. Consequently, a considerable amount of time (for example, several to several tens of microseconds) is required until the transistor Q1 changes from on to off. Namely, a longer abnormality determination time from the time an abnormality caused by the terminal 20 being open has actually occurred until that abnormality is detected can be secured by interrupting discharge of the base charge. Abnormality determination time can be adjusted with the current value of the current source i1 connected to the collector of the transistor Q1. Abnormality determination time can be prolonged by increasing the current value of the current source A. In addition, abnormality determination time can also be adjusted with the resistance value of the resistor R2 connected between the anode of the diode D1 and ground. Since discharge time of the base charge becomes longer as the current value of the resistor R2 increases, abnormality determination time can be prolonged.

Figure 4:
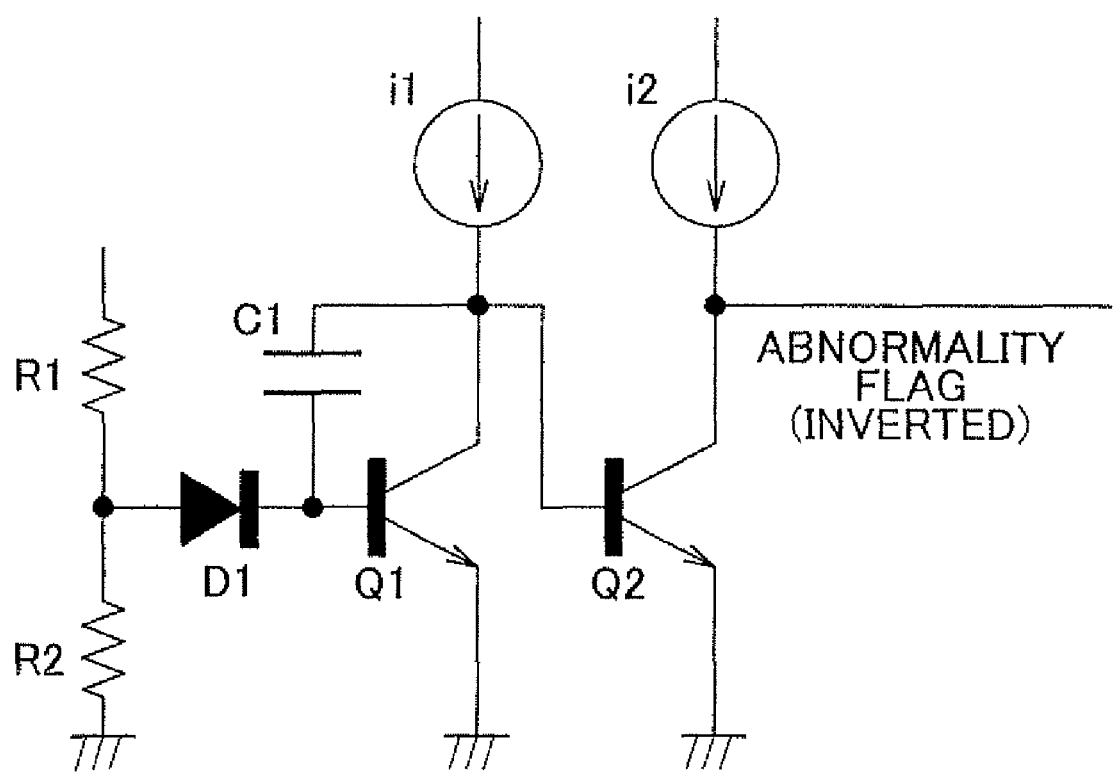
FIG. 4 shows an example of a configuration for prolonging the abnormality determination time of an open terminal detection device.

In addition, in the case of desiring to further prolong abnormality determination time, a condenser C1 may be connected between the base and collector of the transistor Q1 as shown in FIG. 4. The condenser C1 is able to achieve a capacitance of "1/direct current amplification factor $h_{FE}$" for the transistor Q1 as compared with connecting between the base and emitter of the transistor Q1 (the emitter is connected to ground in FIG. 1) by utilizing a mirror effect of the transistor Q1. Thus, by inserting the condenser C1 between the base and collector of the transistor Q1, an increase in mounting area attributable to addition of the condenser C1 can be inhibited while also making it possible to prolong abnormality determination time corresponding to the capacitance of the condenser C1.

On the other hand, the transistor Q1 enables rapid switching from off to on as a result of base current being supplied from the transistor Q3 of the current source 30A in the forward direction of the diode D1 during recovery from an abnormal state to a normal state.

According to the embodiment as described above, a normal recovery time can be set to be shorter than an abnormality determination time by providing a difference between the abnormality determination time from the time of an occurrence of an open failure of the terminal 20 to the time of detection of that open failure, and the normal recovery time from the time of recovery of the terminal 20 to a normal state to the time of detection of that recovery.

In addition, according to the above-mentioned embodiment, an object of detecting an open IC terminal can be achieved with a comparatively low number of elements and small element surface area, while also making the IC inexpensive.

In the embodiment described above, the control unit 40 may also be mounted outside the semiconductor device 100 instead of being contained therein.

Figure 5:
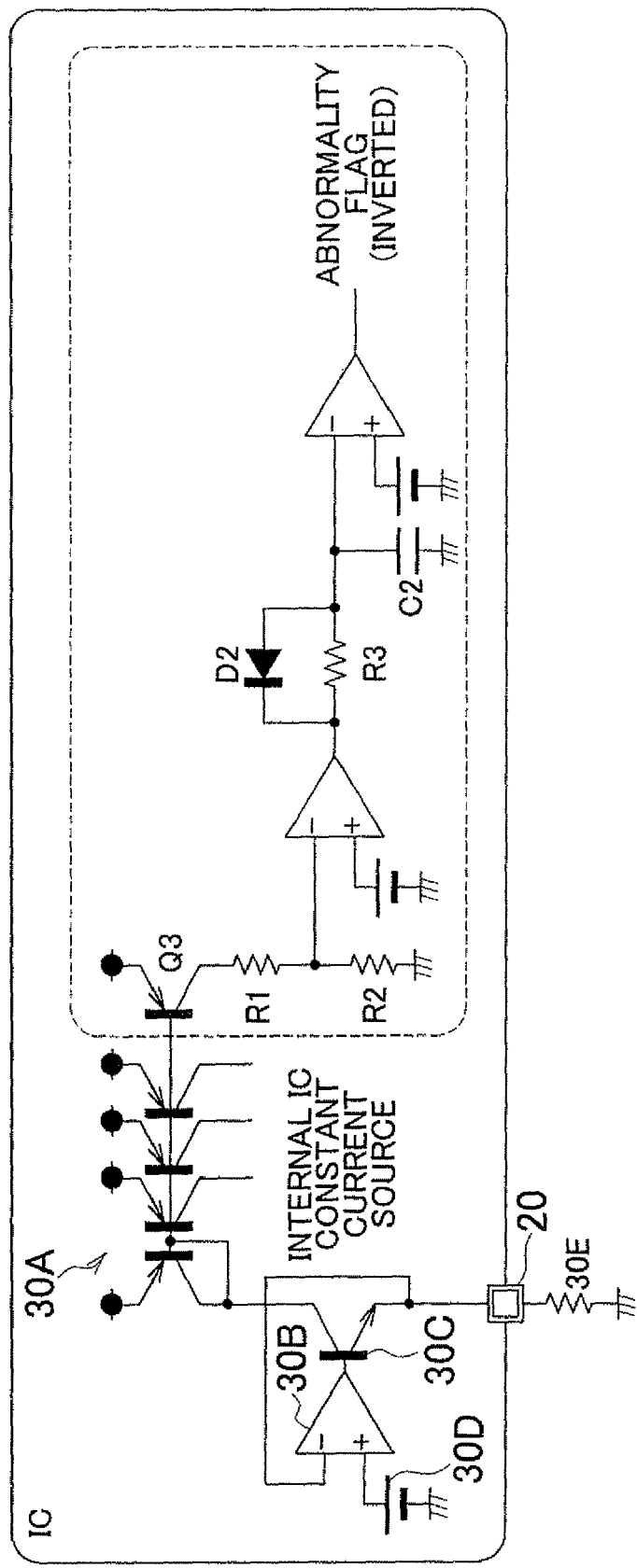
FIG. 5 shows a first comparative example of an open terminal detection circuit.
Figure 6:
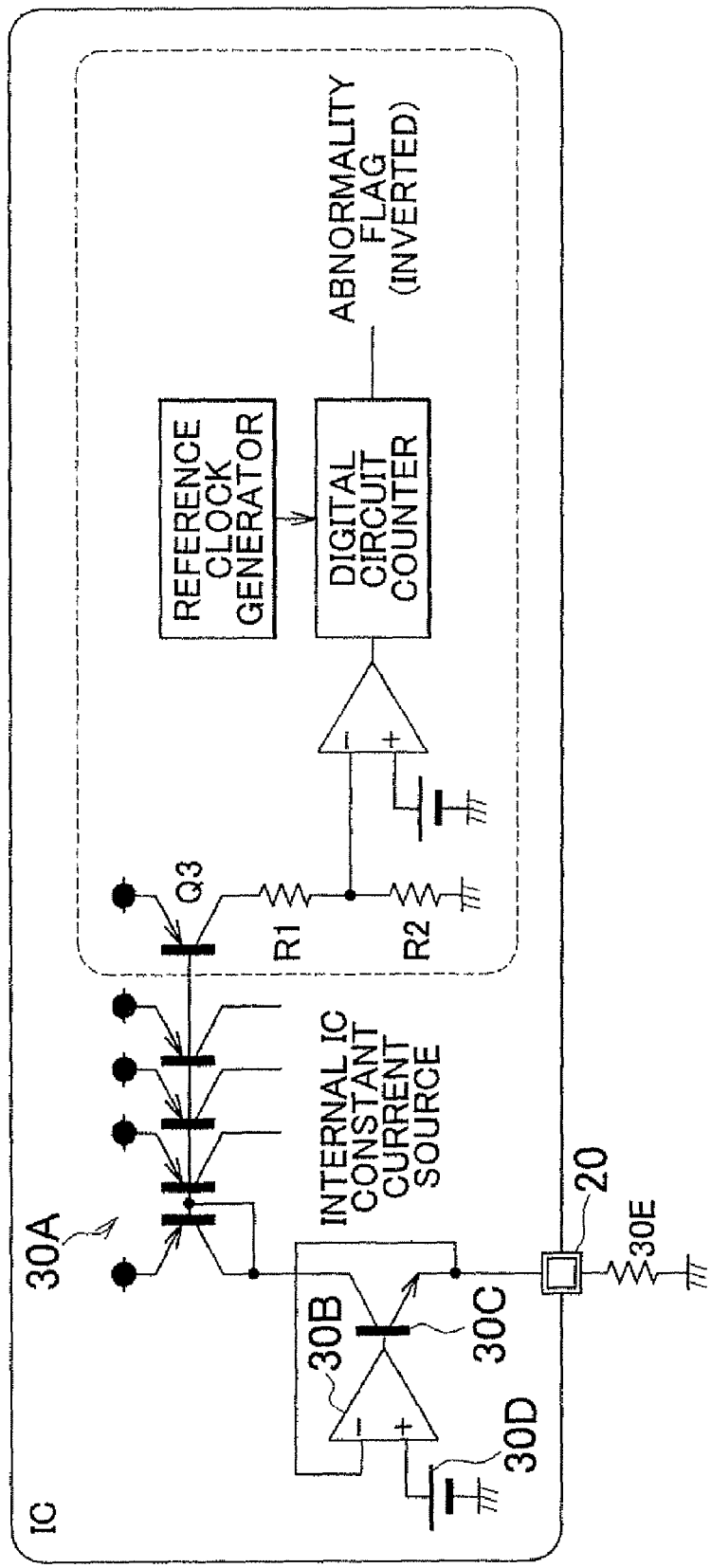
FIG. 6 shows a second comparative example of an open terminal detection circuit.

For example, the configurations shown in FIGS. 5 and 6 may also be used as open terminal detection circuits that carry out the operation shown in FIG. 2 in addition to the open terminal detection circuit 10.

In the configuration of FIG. 5, an abnormality determination time is secured by the generation of a time constant by a condenser C2 and a resistor R3. In the case of normal recovery, the resistance of the resistor R3 is cancelled by a diode D2 provided in parallel with the resistor R3 causing the condenser C2 to rapidly discharge. On the other hand, in the configuration of FIG. 6, time is measured with a counter by a digital circuit. This requires a reference clock generator (oscillation circuit such as a CR circuit, Ceralock circuit or crystal oscillator) for the digital circuit. In addition, it is also necessary to provide a circuit that cancels the counter during normal recovery.

In this manner, it is necessary to increase the capacitance of the condenser C2 and the resistance of the resistor R3 in order to secure abnormality determination time in the configuration of FIG. 5, while it is necessary to provide a comparatively large circuit such as a reference clock circuit to secure abnormality detection time while shortening normal recovery time in the configuration of FIG. 6. Thus, circuit size and IC chip area end up increasing in the case of both of these configurations. In contrast, according to the configuration as claimed in the embodiment of the invention, an open terminal can be detected while reducing the number of elements and the element surface area in comparison with the configurations of FIGS. 5 and 6.

While the invention has been described with reference to example embodiments thereof, it is to be understood that the invention is not limited to the described embodiments or constructions. The invention is intended to cover various modifications and equivalent arrangements. In addition, while the various elements of the disclosed invention are shown in various example combinations and configurations, other combinations and configurations, including more, less or only a single element, are also within the scope of the appended claims.

What is claimed is:

1. An open terminal detection device that detects an open terminal and a recovery from said open terminal, comprising:
    a diode;
    a transistor that is supplied with a base current from a current source through the diode that limits discharge of a base charge of the transistor, in which the base current decreases corresponding to an increase in an external impedance of the terminal, wherein the terminal is supplied by the current source; and
    an output circuit adapted to the transistor, the output circuit outputting an output signal in coordination with on/off switching of the transistor,
    wherein said diode is arranged such that
    on occurrence of an open terminal, a switching off of the transistor is prolonged,
    on occurrence of a recovery from an open terminal, a switching on of the transistor happens rapidly, and
    a time from a time of a recovery from an open terminal to a time of detection of said recovery is shorter than a time from a time of an occurrence of an open terminal to a time of detection of said open terminal.

2. The open terminal detection device according to claim 1, further comprising a condenser inserted between a base and a collector of the transistor.

3. The open terminal detection device according to claim 1, wherein the diode is inserted into a supply path that supplies the base current to the transistor.

4. The open terminal detection device according to claim 1, further comprising:
- a second transistor provided between the current source and the diode; and
- a voltage divider circuit provided between a collector of the second transistor and ground.

5. The open terminal detection device according to claim 4, wherein the voltage divider circuit is configured by directly connecting a first resistor and a second resistor, and the diode is connected to a connection point of the first resistor and the second resistor.

6. A semiconductor device, comprising:
- the open terminal detection device according to claim 1, and
- a control unit that carries out control based on the output signal.

* * * * *